United States Patent
Tani

(10) Patent No.: US 6,216,589 B1
(45) Date of Patent: Apr. 17, 2001

(54) PRINTING PASTE SUPPLY DEVICE

(75) Inventor: Okie Tani, Tokyo (JP)

(73) Assignee: Tani Denkikogyo Co., Ltd., Tokyo (JP)

( * ) Notice: Subject to any disclaimer, the term of this patent is extended or adjusted under 35 U.S.C. 154(b) by 0 days.

(21) Appl. No.: 09/417,674

(22) Filed: Oct. 14, 1999

(30) Foreign Application Priority Data

Oct. 14, 1998 (JP) .................................................. 10-008526

(51) Int. Cl.⁷ ............................ B05C 17/04; B41L 13/18; B41L 27/00
(52) U.S. Cl. ............................................. 101/123; 101/124
(58) Field of Search ...................................... 101/123, 124, 101/202–210, 295, 300, 301–305, 307–315, 318–321, 323–326, 329–331, 335, 337, 338–350.1, 351.1–351.4, 355–358, DIG. 34, 491; 118/612, 259; 222/161, 162, 180–182, 185.1, 190, 634, 636, 209, 214, 249, 258, 262, 263, 319, 321.1, 321.2, 321.7–321.9, 333, 372, 373, 379, 383.1–384, 394, 398, 399–400.5, 401, 415

(56) References Cited

U.S. PATENT DOCUMENTS

| | | | |
|---|---|---|---|
| 4,622,239 | * 11/1986 | Schoenthaler et al. | 427/96 |
| 5,287,806 | * 2/1994 | Nanzai | 101/123 |
| 5,309,837 | * 5/1994 | Nanzai | 101/425 |
| 5,483,879 | * 1/1996 | Tani et al. | 101/123 |
| 5,640,907 | * 6/1997 | Tani et al. | 101/366 |
| 5,802,970 | * 9/1998 | Tani | 101/123 |
| 5,806,423 | * 9/1998 | Tani | 101/123 |
| 5,947,022 | * 9/1999 | Freeman et al. | 101/123 |

FOREIGN PATENT DOCUMENTS

| | | | |
|---|---|---|---|
| 40306153A | * 3/1991 | (JP) | 101/123 |
| 2000006368A | * 1/2000 | (JP) . | |

* cited by examiner

Primary Examiner—Kimberly Asher

(57) ABSTRACT

A printing paste supply degree can stir up and knead past contained in a syringe extremely efficiently and extrudes the paste in a condition suitable for a screen printing through a discharge opening of the syringe. The paste supply device comprises a syringe made from specific resin and a mixer unit which is fitted on an inlet end portion of the syringe. The mixer unit comprises a lid which is hermetically fitted on the inlet opening end portion, a belt drive mechanism disposed above the lid, a mixer member which is operatively connected to the belt drive mechanism by way of a power transmission device so as to be driven for rotation about the central axis of the syringe, a pressurizing member which is mounted on the mixer member in such a manner that the pressurizing member is slidable relative to the mixer member and is rotatable with the mixer member, and a compressed air supply pipe which supplies compressed air into the syringe from the inlet opening side so as to forcibly make the pressure member slide toward the discharge opening.

6 Claims, 3 Drawing Sheets

FIG. 4
FIG. 5
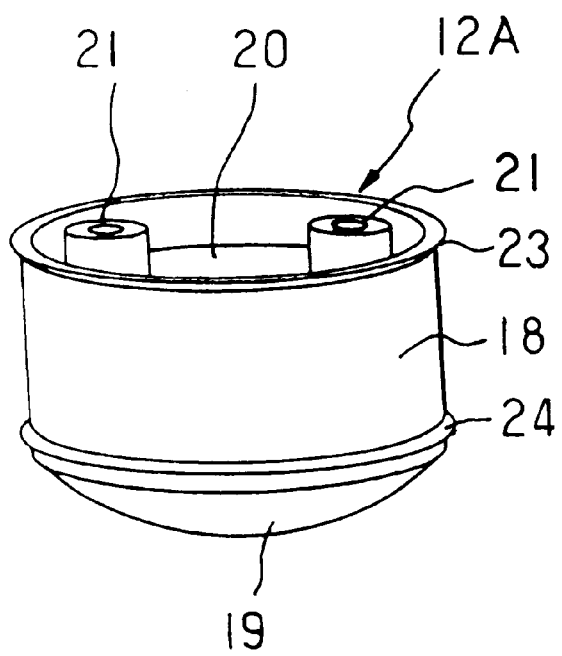
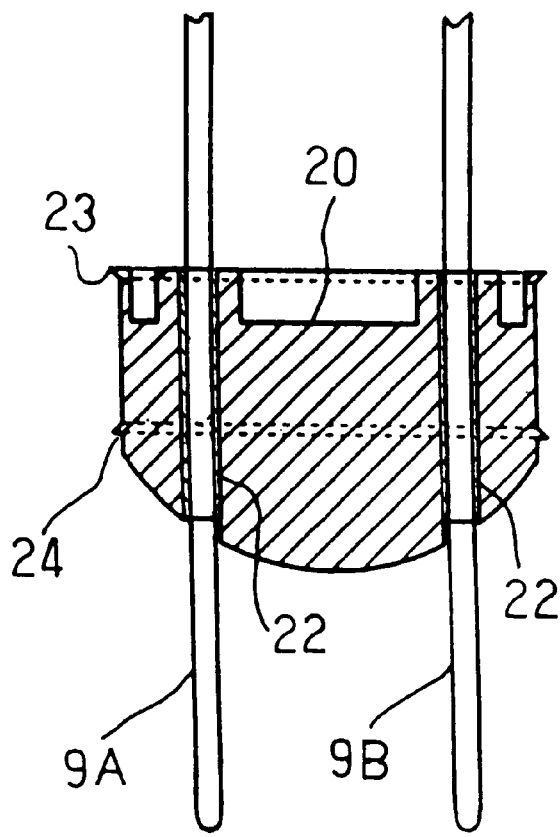

PRINTING PASTE SUPPLY DEVICE

BACKGROUND OF THE INVENTION

1. Field of the Invention

This invention relates to a printing paste supply device for supplying a printing paste to an object, such as a squeegee apparatus or a screen printing machine by extruding the paste from a syringe which contains therein the paste, such as a solder paste prepared by mixing solder powder particles with a liquid with flux having a high viscosity, a conductive adhesive and the like.

2. Description of the Prior Arts

This type of printing paste supply devices which are arranged to extrude the printing paste contained in the syringe through a discharge opening thereof by applying to the paste an air pressure of the compressed which is introduced into the syringe or by means of a movable plate which is caused to move to push the paste moved by the pressure of compressed air are already known.

In a screen printing, a squeegee slides linearly on an upper surface of a screen in frictional contact therewith to force the paste through pattern apertures in the screen and on to an object to be printed. In order to ensure the uniformity of the quality or finished condition of printing as well as the accuracy of printing, etc., it requires to prevent change in viscosity of the printing paste at the time of performing each printing. In case where the printing paste is to be printed onto a printed circuit board by means of a screen printing machine, it must have a predetermined viscosity which is suitable for printing. This is particularly important since the miniaturization of printed circuit boards is accelerated day by day and accordingly a high density printing using a screen having minute pattern apertures therein is desired.

Among commercially available solder pastes for screen printing which are applicable to printed circuit boards, a solder paste which is produced by mixing solder powder particles of a low melting point having a composition of around 63% of Sn and around 37% of Pb and a liquid flux having a high viscosity and contains around 9.3% of flux is widely used. This type of commercially available solder paste is filled in a syringe-like container or a short cylindrical container made from synthetic resin.

The solder paste is a kind of material which has such a property that it has no fluidity when it is held in a stationary condition and obtains the fluidity when it is agitated, stirred up or vibrated that is, thixotropy. Accordingly, it is difficult to use the solder paste, as it is, after taking it out from the container, so that, in use, it is necessary to give the viscosity suitable for printing to the solder paste by agitating, stirring up or vibrating the solder paste. The known printing paste supply devices which extrude the past by merely making use of a pneumatic pressure, however, lack a function to sufficiently stir up and knead the paste and hence, additional steps or devices for sufficiently stirring up and kneading the paste become necessary before printing.

The present invention has been made in view of the above-mentioned drawbacks or disadvantages and it is a primary object of the present invention to provide a printing paste supply device which is constructed such that the printing paste contained in the syringe can be effectively and efficiently stirred up and kneaded and then is discharged from a discharge opening of the syringe while being given a viscosity suitable for the screen printing, and which is particularly useful for screen printing machines which are used in producing surface mount technology circuit boards suitable for use in high technology products.

SUMMARY OF THE INVENTION

To achieve the above object of the present invention, there is provided a printing paste supply device which comprises a syringe and a mixer unit which is removably mounted on the inlet opening side of the syringe and which is designed so as to be capable of effectively and efficiently stirring up and kneading the paste contained in the syringe before extruding it from a discharge opening of the syringe. The mixer unit comprises a lid which is hermetically mounted on the inlet opening end in such a manner the lid covers said opening end portion of the syringe, a belt driving mechanism disposed above said lid, a mixer member operatively connected to the belt driving mechanism by way of a transmission mechanism and comprising a plurality of rods protruding into the syringe and driven for rotation about the central axis of the syringe, a pressurizing member slidably mounted on said rods and rotated therewith, and a compressed air supply means for supplying compressed air into the syringe from said inlet opening side so as to forcibly make the pressurizing member slide toward the discharge opening side of the syringe.

Other objects, features and advantages of the present invention will become apparent from the following description made with reference to the accompanying drawings.

BRIEF DESCRIPTION OF THE DRAWING

The accompanying drawings which are incorporated in and constitute a part of the disclosure illustrate one embodiment of the invention and, together with the demonstrations will serve to explain the principles of the invention.

FIG. 4 is a perspective view of a variant of the pressurizing member shown in FIGS. 1 to 3; and FIG. 5 is a vertical cross-sectional view of the variant showing the state in which it is slidably mounted on mixer rods shown in FIGS. 1 to 3.

DETAILED DESCRIPTION OF THE PREFERRED EMBODIMENT

Figure 1:
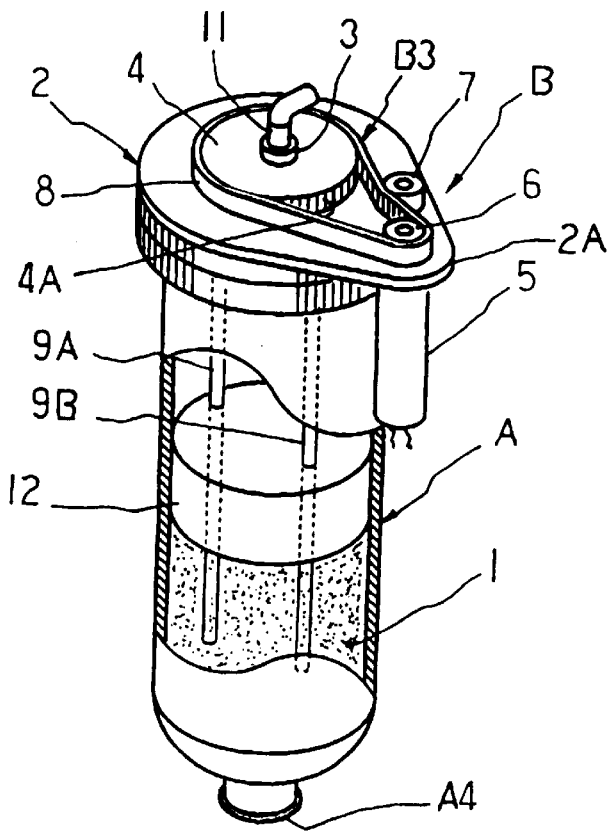
FIG. 1 is a perspective view of a printing paste supply device as one embodiment of the present invention with a part shown in a longitudinal cross section.
Figure 2:
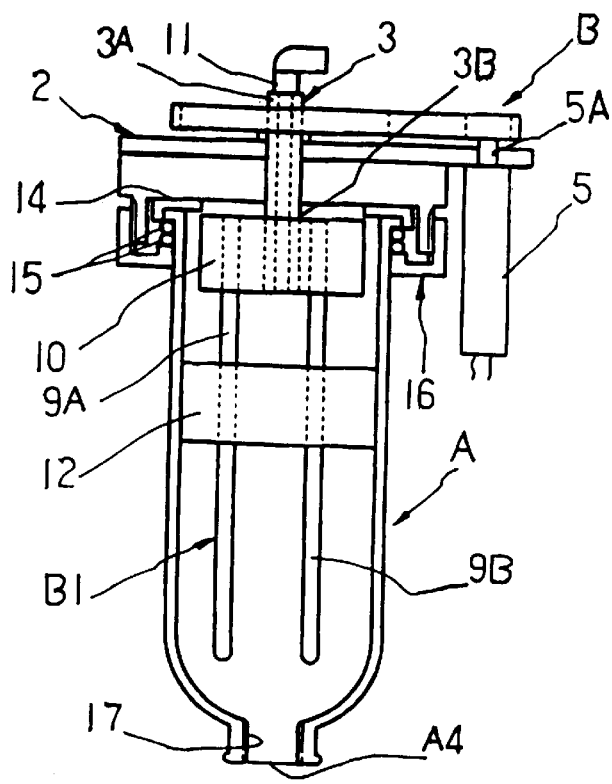
FIG. 2 is a longitudinal cross sectional side view of the embodiment shown in FIG. 1.
Figure 3:
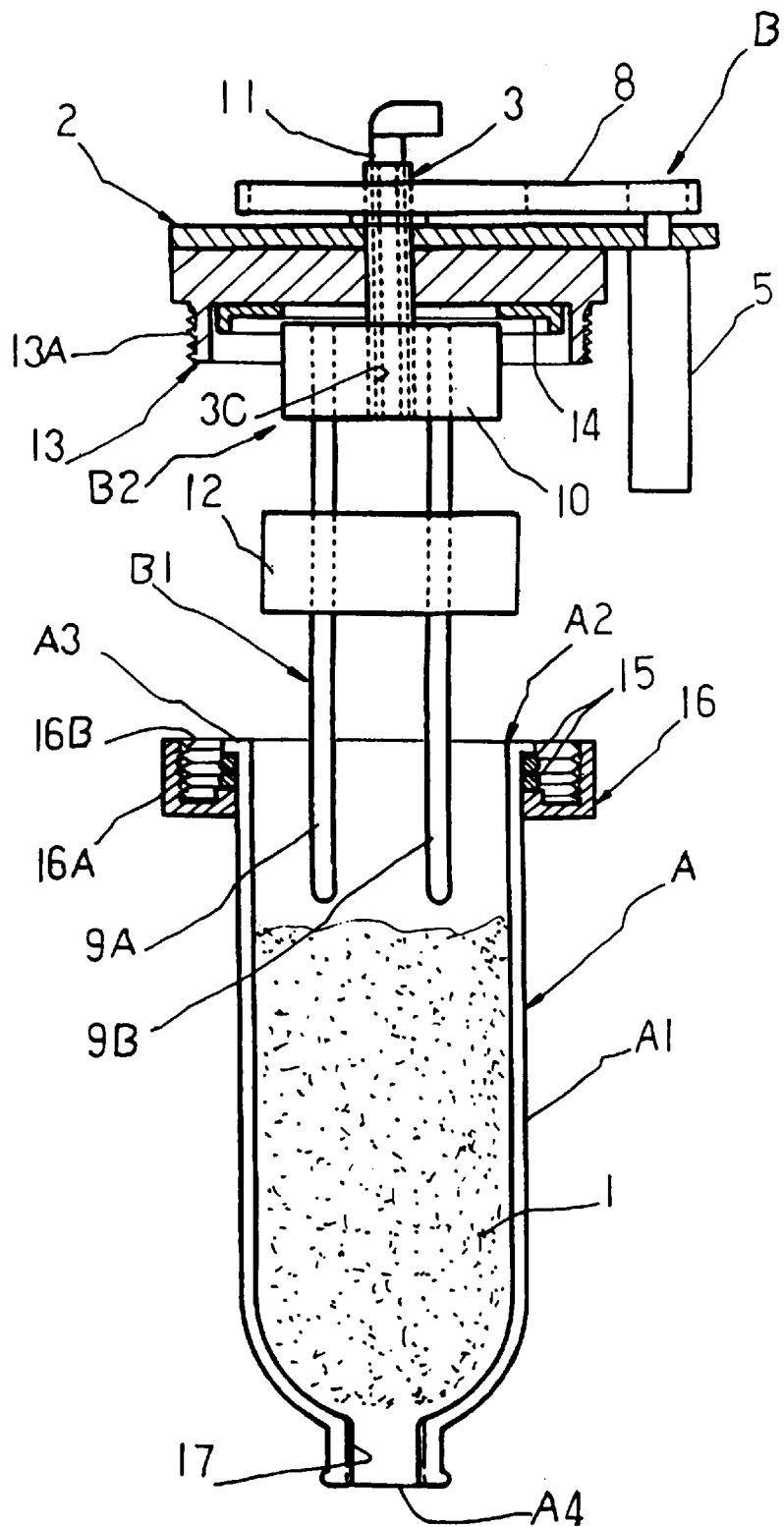
FIG. 3 is an enlarged exploded side view of the embodiment with a part shown in a longitudinal cross section.

FIGS. 1 to 3 show a preferred embodiment of the present invention. In the drawings, A indicates a syringe which is formed of a synthetic resin such as polypropylene. B indicates a mixer unit which is constructed such that it is removably mounted on the side of an inlet opening portion A2 of the syringe A like a cap. The mixer unit B is so constructed as to stir up and knead a printing paste 1 stored in the inside of the syringe A and extrudes the paste 1 from a discharge opening A4 of the syringe A. The syringe A includes a cylindrical peripheral wall A1 and an outwardly extending annular protrusion A3 formed on the inlet opening end A2.

The mixer unit B comprises a lid 2 which is hermetically fitted on the inlet opening and A2 of the syringe A so as to cover it, a mixer member B1 comprising a plurality of rods which protrudes into the syringe A and driven for rotation about the central axis of the syringe A to stir up and knead the paste 1 contained in the syringe A and a belt drive mechanism B3 which gives the rotating motion to the mixer member B1 by way of a power transmission device B2. The belt drive mechanism B3 shown as an example in the drawings includes a driven pulley 4 having a large diameter which is fixedly secured to an upper protruding portion 3A of a tubular rotating shaft 3 which passes through the lid 2 and protrudes upwardly and downwardly and is provided with a knurling 4A on an outer peripheral surface thereof, a small-sized electric motor 5 which is mounted on a horizontally protruding portion 2A of the lid 2 in a suspended manner, a driving pulley 6 having a small diameter which is fixedly secured to an output shaft 5A of the electric motor which passes through the horizontally protruding portion 2A and protrudes upwardly and is provided with a knurling on an outer peripheral surface thereof, and an endless belt 8 which is extended between the driving pulley 6 and the driven pulley 4 by way of a take-up pulley 7. The power transmission device B2 includes the above-mentioned tubular shaft 3 and a disc-like rotating member 10 which is fixedly secured to a lower protruding portion 3B of the tubular shaft 3 in such a manner that the tubular shaft 3 passes through the rotating member 10 and on which at least two rods 9A, 9B constituting the mixer member B1 are mounted at offset positions. Numeral 11 indicates a compressed supply tube for supplying compressed air into the inside of the syringe A from its inlet opening side so as to forcibly slide a disc-like pressurizing member 12 which is made from synthetic resin such as polyurethane and which is slidably mounted on the rods 9A, 9B and rotated therewith. The compressed air supply tube 11 slidably and rotatable passes through an axial hole 3C formed in the tubular rotating shaft 3 and opens at the lower surface of the rotating member 10. The disc-like pressurizing member 12 shown in FIGS. 1 to 3 has substantially the same diameter as the inner diameter of the cylindrical wall portion A1 of the syringe A and an outer peripheral surface of the pressurizing member 12 is in sliding contact with an inner peripheral surface of the cylindrical peripheral wall portion A1.

Numeral 13 indicates an annular fitting portion protruding downwardly from a lower surface of the lid 2 and the lid 2 is fitted on the inlet opening end A2 of the syringe A at the annular fitting portion 13. As illustrated in FIG. 3, male threads 13A are formed on an outer peripheral surface of the annular fitting portion 13, while a gasket 14 which is brought into contact under pressure with a top surface of the outwardly extending annular protrusion A3 of the opening portion A2 of the syringe A is attached to a lower surface of the lid 2 at the inside of the annular fitting portion 13. Numeral 15 indicates O rings which are fitted on the syringe A from the discharge opening A4 side of the syringe A and are rested on a lower surface of the outwardly extending annular protrusion A3. The O rings 15 are brought into resilient contact with the lower surface of the outwardly extending annular protrusion A3 by means of a mounting ring 16 which is also fitted on the syringe A from the discharge opening A4 side. As shown in drawings, the mounting ring 16 has an approximately U-shaped cross section and female threads 16B into which the male threads 13A of the annular fitting portion 13 can be threaded are formed on an inner surface of an annular peripheral wall 16A of the mounting ring 16. Due to such a construction, as the male threads 13A are brought into threaded engagement with the female threads 16B, the annular gasket 14 is brought into contact with the upper surface of the annular protrusion A3 whereby the lid 2 is hermetically fitted on the inlet opening portion A2 of the syringe A. Numeral 17 indicated a threaded portion formed on the inner wall surface of the discharge opening A4 of the syringe A and the discharge opening A4 is opened or closed by making a plug having a threaded portion (not shown in drawings) threaded into the threaded portion 17 or removed from the threaded portion 17.

FIGS. 4 and 5 show a variant of the pressurizing member 12. The pressurizing member 12A as a variant is made from rubber material in the form of a substantially hemisphere having two annular fins 23, 24 which are provided on its out cylindrical surface. These fins 23, 24 can be hermetically and slidably brought into contact with the inner cylindrical surface of said syringe A. In the drawings, numeral 19 show a rounded tip portion, 20 is a recessed portion which is designed to be capable of fully receiving the pressure of compressed air, 21 and 21 are cylindrical bores and numerals 22 and 22 are pipes into which rods 9A, 9B are slidably inserted.

With the printing paste supply device having the above-mentioned construction, when the mixer unit B is mounted on the inlet opening A2 of the syringe A, which contains therein printing paste 1, as a cap and then the motor 5 is rotated, the rotation of the motor 5 is transmitted to the driven pulley 4 having a large diameter by way of the driving pulley 6 having a small diameter and the endless belt 8. The rotation of the driven pulley 4 is transmitted to the mixer member B1 by way of the tubular rotating shaft 3 and the rotating member 10 and hence, the offset rods 9A, 9B which constitute the mixer member B1 and the pressurizing member 12 mounted on these offset rods 9A, 9B are rotated therewith. In this case, since knurling is formed on the outer peripheral surfaces of the driving pulley 6 and the driven pulley 4 which works as belt pulleys and the take-up pulley 7 is used, the slippage of the endless belt 8 can be prevented, thus increasing the transmission power.

As the offset rods 9A, 9B are caused to be driven for rotation, the offset rods 9A, 9B which differ in the radius of rotation from each other perform the action of stirring up the paste 1 while drawing concentric circles, thereby causing the paste 1 to be efficiently and effectively kneaded so that the paste is given the fluidity the viscosity suitable for printing. In this case, the disc-like pressurizing member 12 also performs the rotational movement while being brought into contact with the solder paste 1 from above, whereby the effect of stirring up and kneading of the paste 1 is enhanced.

Furthermore, as compressed air is introduced into the syringe A from the outside by way of the compressed air supply tube 11 simultaneously with the above-mentioned stirring operation, the pressurizing member 12 is forced to slide downwardly upon receiving the air pressure generated by compressed air and hence, the pressurizing member 12 is moved downwardly under pressure while being rotated and with said eccentric rods 9A, 9B about the longitudinal axis paste 1 with its lower surface, whereby the effect of kneading the paste is further enhanced and the paste 1 is caused to be extruded through the discharge opening A4 of syringe A under a well kneaded condition. In this manner, according to the present invention, the paste is not only effectively and efficiently stirred up and kneaded, but also the extruding speed is greately increased thus enabling the smooth transfer of the well kneaded paste suitable for screen printing to a given object. Particularly, the paste supply device of the present invention is suitable for use in supplying solder paste to a screen printing apparatus having a past-storing chamber from which the paste is automatically supplied onto a screen during printing. This kind of the screen printing apparatuses have been disclosed by the inventor in the patents including U.S. Pat. Nos. 5,452,655, 5,611,274, etc.

It is to be understood that the present invention may be embodied in other specific form without departing from the spirit or essential characteristics of the present invention, The preferred embodiments are therefore to be considered illustrative and not restrictive.

What is claimed is:

1. A printing paste supply device comprising a syringe having an inlet opening on one end of said syringe and a discharge opening and made from synthetic resin and a mixer unit removably mounted on the inlet opening end of said syringe, said mixer unit being arranged to stir up and knead paste contained in said syringe and to extrude it from the discharge opening, of said syringe, said mixer unit comprising a lid which is hermetically fitted on the inlet opening end of said syringe in such a manner that the lid covers the inlet opening end of said syringe, a belt driving mechanism disposed above said lid, a mixer member operatively connected to the belt driving mechanism by way of a power transmission mechanism and comprising a plurality of rods protruded into said syringe and driven for rotation about the central axis of said syringe, a pressurizing member slidably mounted on said rods and rotated therewith, and a compressed air supply means for supplying compressed air into said syringe from said inlet opening side so as to forcibly make said pressurizing member slide toward said discharge opening side of said syringe.

2. A printing paste supply device as claimed in claim 1, wherein said belt drive mechanism comprises a driven pulley having a large diameter which is fixedly secured to an upper protruding portion of a tubular rotating shaft protruding upwardly and downwardly while passing through said lid, a small-sized electric motor fixedly mounted on said lid, a driving pulley having a small diameter which is fixedly secured to an output shaft of said electric motor and an endless belt which is extended between said driving pulley and said driven pulley, said power transmission mechanism comprising said tubular rotating shaft and a rotating member which is fixedly secured to a lower protruding portion of said tubular rotating shaft in such a manner that said tubular rotating shaft passes through said rotating member and on which a plurality of rods constituting said mixer member are mounted, said compressed air supply means comprising a tube which passes rotatably through an axial hole formed in said tubular rotating shaft and opens at the lower surface of said rotating member.

3. A printing paste supply device as claimed in claim 1, wherein the pressurizing member is made from synthetic resin, such as polyurethane in the form of a thick disk.

4. A printing paste supply device as claimed in claim 1, wherein the pressurizing member is made from rubber material substantially in the form of a hemisphere having one or a plurality of annular fins which hermetically and slidably contact the inner cylindrical surface of said syringe.

5. A printing paste supply device as claimed in claim 1, wherein O rings are brought into resilient contact with the lower surface of an outwardly extending annular protrusion formed at the inlet opening end portion of said syringe by way of a mounting ring which is fitted on said syringe from said discharge opening side, and an annular gasket, which is capable of being brought into contact with the upper surface of said annular protrusion is adhered to a lower surface of the inside of an annular fitting portion of said lid, and male threads formed on an outer peripheral surface of said annular fitting portion of said lid are threaded into female threads formed on an inner peripheral surface of an outer peripheral wall of said mounting ring having a U-shaped cross section so that said annular gasket is brought into contact with the upper surface of said annular protrusion under pressure so that said lid body can be hermetically fitted on the inlet opening end portion of said syringe.

6. A printing paste supply device comprising a syringe having an inlet opening or one end of said syringe and a discharge opening and made from synthetic resin and a mixer unit removably mounted on the inlet opening end said syringe, said mixer unit being arranged to stir up and knead paste contained in said syringe and to extrude it from the discharge opening of said syringe, said mixer unit comprising a lid which is hermetically fitted on the inlet opening end of said syringe in such a manner that the lid covers the inlet opening end of said syringe, a belt driving mechanism disposed above said lid, mixer member operatively connected to the belt driving mechanism by way of a power transmission mechanism and comprising a plurality of rods protruded into said syringe and driven for rotation about the central axis of said syringe, a pressurizing member slidably mounted on said rods and rotated therewith, and a compressed air supply means for supplying compressed air into said syringe from said inlet opening side so as to forcibly make said pressurizing member slide toward said discharge opening side of said syringe, wherein said belt drive mechanism comprises a driven pulley having a large diameter which is fixedly secured to an upper protruding portion of a tubular rotating shaft protruding upwardly and downwardly while passing through said lid, a small-sized electric motor fixedly mounted on said lid, a driving pulley having a small diameter which is fixedly secured to an output shaft of said electric motor and an endless belt which is extended between said driving pulley and said driven pulley, said power transmission mechanism comprising said tubular rotating shaft and a rotating member which is fixedly secured to a lower protruding portion of said tubular rotating shaft in such a manner that said tubular rotating shaft passes through said rotating member and on which a plurality of rods constituting said mixer member are mounted, said compressed air supply means comprising a tube which passes rotatably through an axial hole formed in said tubular rotating shaft and opens at the lower surface of said rotating member.

\* \* \* \* \*